(12) United States Patent
Gagne et al.

(10) Patent No.: US 7,612,449 B2
(45) Date of Patent: Nov. 3, 2009

(54) OPTIMIZED POWER DELIVERY TO HIGH SPEED, HIGH PIN-COUNT DEVICES

(75) Inventors: Justin Joseph Rosen Gagne, San Diego, CA (US); Mark Stephen Veatch, San Diego, CA (US); Ryan Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/025,486

(22) Filed: Dec. 28, 2004

(65) Prior Publication Data

US 2005/0184390 A1    Aug. 25, 2005

Related U.S. Application Data

(60) Provisional application No. 60/547,756, filed on Feb. 24, 2004.

(51) Int. Cl.
*H01L 23/52* (2006.01)
(52) U.S. Cl. .................. 257/738; 257/E23.021; 438/613
(58) Field of Classification Search .............. 257/691, 257/698, 730, 737, 738, 773, 780, 784, 786, 257/E23.021
See application file for complete search history.

(56) References Cited

U.S. PATENT DOCUMENTS

| | | | |
|---|---|---|---|
| 5,640,048 A * | 6/1997 | Selna ................. | 257/738 |
| 6,064,113 A | 5/2000 | Kirkman ............. | 257/691 |
| 6,198,635 B1 | 3/2001 | Shenoy et al. ....... | 361/760 |
| 6,359,341 B1 * | 3/2002 | Huang et al. ........ | 257/778 |
| 6,501,664 B1 | 12/2002 | Krieger ............... | 361/782 |
| 6,703,697 B2 * | 3/2004 | Leahy et al. ......... | 257/678 |
| 6,759,329 B2 * | 7/2004 | Cheng et al. ........ | 438/666 |
| 2002/0030979 A1 | 3/2002 | Chang ................. | 361/780 |
| 2003/0047356 A1 * | 3/2003 | Searls et al. ........ | 174/262 |
| 2003/0206405 A1 | 11/2003 | Zu et al. .............. | 361/792 |
| 2004/0070956 A1 * | 4/2004 | Antu et al. .......... | 361/763 |

FOREIGN PATENT DOCUMENTS

| DE | 19904363 | 2/1999 |
|---|---|---|
| WO | 0158224 | 8/2001 |

* cited by examiner

*Primary Examiner*—Thao X Le
*Assistant Examiner*—Ajay K Arora
(74) *Attorney, Agent, or Firm*—Jiayu Xu

(57) ABSTRACT

A high-speed semiconductor device includes a substrate having an upper substrate surface, a lower substrate surface, and a periphery bounding the upper and the lower substrate surfaces, the substrate further having an upper substrate ground trace providing an electrical path to the lower substrate surface through a substrate ground via; an array of solder balls attached to the lower substrate surface, the array of solder balls including a plurality of ground solder balls disposed at the periphery and electrically connected to the substrate ground via.

16 Claims, 6 Drawing Sheets

OPTIMIZED POWER DELIVERY TO HIGH SPEED, HIGH PIN-COUNT DEVICES

CROSS-REFERENCE TO RELATED APPLICATIONS

This application claims the benefit of U.S. Provisional Patent Application No. 60/547,756, filed on 24 Feb. 2004.

BACKGROUND

The present application generally relates to high-speed integrated circuit devices and, more particularly, to a method and system for optimizing power delivery to high-speed, high-pin count semiconductor devices.

Wireless communication systems have increased in number and in complexity over recent years. Such complexity has necessitated that the wireless communication systems, and handheld wireless devices in particular, utilize multilayer substrates with increased component packaging density. The use of multilayer substrates has allowed for the placement of segmented power and ground planes on interior substrate layers. Such configurations may result in long path lengths between, for example, a high-speed device and a corresponding decoupling capacitor. As a consequence, electromagnetic interference (EMI) problems may arise when high-speed devices are used on multilayer substrates with power and ground planes designed as multiple, segmented regions.

High-speed devices such as microprocessors may function using extremely short bursts of current. At high operating speeds, signal propagation delays, switching noise, and crosstalk between wire bonds due to mutual inductance and self-inductance contribute to signal degradation. The mutual inductance may result from interaction between magnetic fields created by signal currents in the wire bonds between the die and traces on the substrate, for example, and the self-inductance may result from the interaction of opposed magnetic fields created by anti-parallel electrical currents. As the number of inputs and outputs to the die continues to increase, external connections become more numerous and complex and, in some instances, result in the undesirably long wire bond leads and conductive substrate traces. Accordingly, faster and ever-increasing signal frequencies have created undesirable signal propagation effects from package lead or trace inductance.

As can be seen, there is a need for a semiconductor package configured to accommodate and substantially overcome inductance-related deficiencies, EMI concerns, and grounding issues so that full advantage of the beneficial aspects of the packaging concept might be realized in a relatively simple, cost-effective manner.

SUMMARY

In one embodiment, a semiconductor device includes a substrate having an upper substrate surface, a lower substrate surface, and a periphery bounding the upper and lower substrate surfaces, the upper substrate surface further having at least one substrate upper ground trace providing an electrical path to at least one substrate lower ground trace on the lower substrate surface through at least one substrate ground via; an array of solder balls attached to the lower substrate surface, and including a plurality of ground solder balls disposed at the periphery and electrically connected to at least one substrate ground via.

In another embodiment, a high-speed semiconductor device includes a substrate having an upper substrate surface, a lower substrate surface, an upper substrate ground trace providing an electrical path to the lower substrate surface through a substrate ground via, and an upper substrate power trace providing an electrical path to the lower substrate surface through a substrate power via; a system printed circuit board including a power supply conductive path and an upper board surface having a ground plane; an array of solder balls attached to the lower substrate surface, the array of solder balls including a plurality of ground solder balls electrically connected to the ground plane and a plurality of power solder balls, each of the power solder balls disposed against an adjacent ground solder ball to form a power/ground solder ball pair; and a die mounted to the upper substrate surface.

In yet another embodiment, a semiconductor device includes a substrate having an upper substrate surface, a lower substrate surface, and a periphery bounding the upper substrate surface and the lower substrate surface, the substrate further having an upper substrate ground trace providing an electrical path to a lower substrate ground trace on the lower substrate surface through a substrate ground via and an upper substrate power trace providing an electrical path to a lower substrate power trace on the lower substrate surface through a substrate power via; a system printed circuit board including an upper board surface having a ground plane, and a power supply plane disposed adjacent the ground plane, the upper board surface including a board ground trace electrically connected to the ground plane, the power supply ground plane further including a board power supply trace disposed opposing the board ground trace; an array of solder balls attached to the lower substrate surface, the array of solder balls including a plurality of ground solder balls disposed in a plurality of outermost rows at a periphery of the substrate and attached to the ground plane, the array of solder balls further including a plurality of power solder balls and electrically connected to the power supply plane, the plurality of power solder ball disposed in a plurality of adjacent outer rows, each the outermost row disposed between the periphery and a corresponding adjacent outer row; a die mounted to the upper surface; a wire bond connecting the die to the upper substrate ground trace; and a decoupling capacitor disposed on the upper board surface and electrically attached to the substrate ground trace.

In a further embodiment, a decoupling branch for attachment to a high speed-die includes a decoupling capacitor; a first conductive path electrically connecting a die ground termination to the decoupling capacitor, the first conductive path including a ground wire bond, a substrate upper ground trace, a substrate ground via, a substrate lower ground trace, a ground solder ball, and a board ground trace; and a second conductive path electrically connecting a die power termination to the decoupling capacitor, the second conductive path including a board power supply trace, a power solder ball, a substrate lower power trace, a substrate power via, a substrate upper power trace, and a power wire bond.

In yet a further embodiment, a semiconductor device includes a substrate having an upper substrate surface, a lower substrate surface, and a periphery bounding the upper and lower substrate surfaces, the upper substrate surface further having at least one substrate upper power trace providing an electrical path to at least one substrate lower power trace on the lower substrate surface through at least one substrate power via; an array of solder balls attached to the lower substrate surface, the array of solder balls including a plurality of power solder balls disposed in outermost rows of the array and electrically connected to at least one substrate power vial the array of solder balls further including a plurality of ground solder balls disposed in adjacent outer rows of the array and electrically connected to a substrate ground via in the substrate; a system printed circuit board including an upper board surface having a power plane electrically connected to at least one of the plurality of power solder balls; and a die mounted to the upper substrate surface.

In another embodiment, a wireless communication device having a high-speed, high pin-count semiconductor device includes a decoupling capacitor; a first conductive path electrically connecting a semiconductor device ground termination to the decoupling capacitor, the first conductive path including a ground wire bond, a substrate upper ground trace, a substrate ground via, a substrate lower ground trace, a ground solder ball, and a board ground trace, where the board ground trace has a length of about one millimeter; and a second conductive path electrically connecting a semiconductor device power termination to the decoupling capacitor, the second conductive path including a board power supply trace, a power solder ball, a substrate lower power trace, a substrate power via, a substrate upper power trace, and a power wire bond.

In a further embodiment, a semiconductor device includes solder ball array means for attaching a substrate to a system printed circuit board having a ground plane and a power supply trace, the solder ball array means disposed within a substrate periphery; decoupling means connected between the ground plane and the power supply trace; and power/ground solder ball pair means disposed at the substrate periphery for electrical attachment of the substrate to the decoupling means.

In still a further embodiment, a method for providing power to a semiconductor device having a substrate attached to an upper surface of a system printed circuit board by means of a solder ball array, includes the steps of: (1) minimizing signal parasitics by utilizing a solder ball disposed at a periphery of a substrate as a ground solder ball to reduce path length for a power signal; and (2) minimizing electromagnetic emissions by utilizing a solder ball adjacent to said ground solder ball to form a power/ground solder ball pair for said power signal.

In yet another embodiment, a method for providing power to a semiconductor device having a ball grid array, includes: (1) a step for utilizing a solder ball disposed at a periphery of a substrate as a ground solder ball to reduce path length for a power signal to minimize signal parasitics; and (2) a step for utilizing a solder ball adjacent to said ground solder ball to form a power/ground solder ball pair for said power signal for minimizing electromagnetic emissions from said power signal.

These and other features, aspects and advantages will become better understood with reference to the following drawings, description and claims.

DETAILED DESCRIPTION

Figure 1:
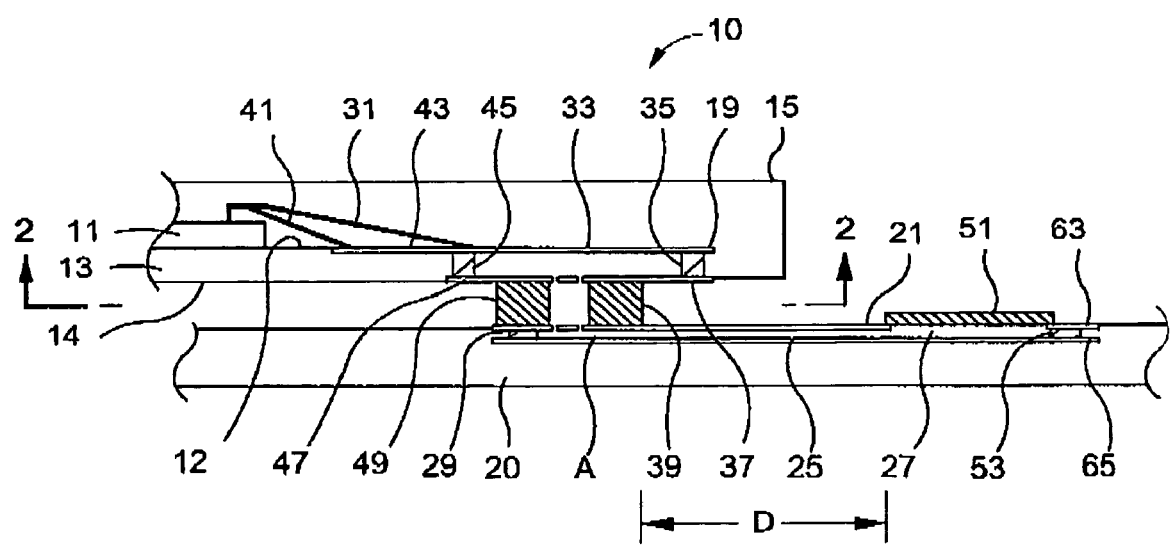
FIG. 1 is a partial cross sectional view of a die mounted on a substrate which is connected to a system printed circuit board by means of a solder ball array, in accordance with one embodiment.

The following detailed description is of the best currently contemplated modes of carrying out the embodiments. The description is not to be taken in a limiting sense, but is made merely for the purpose of illustrating the general principles of the embodiments, since the scope is best defined by the appended claims.

Broadly, a high-speed device is provided having a signal path with low inductance characteristics which, in contrast to the prior art, allow for higher frequency signals and power transfers with little voltage drop and with reduced electromagnetic emission. The embodiments may include power/ground pin pairs positioned at the periphery of the device to minimize voltage droop. In comparison, conventional high-speed devices may provide power pins at or near the center of the device so as to utilize outer pins for signals.

The embodiments may further include a substrate having vias of minimal length to minimize voltage drop, in comparison to longer vias found in conventional substrates. There may also be included a substrate having power and ground planes near a substrate surface to reduce electromagnetic emission, in comparison to conventional multilayer substrates with interior power and ground planes. One example of electronic devices that could benefit from application of the embodiments is handheld wireless communication devices such as cell phones. However, it should be understood that application of the disclosed embodiments is not limited to communication devices.

In general, the performance of a power supply system used for high-speed semiconductor devices can be improved if parasitics are reduced in the power supply system. Printed circuit boards for conventional applications can provide continuous, well-controlled power and ground planes to reduce such parasitics. However, because mobile electronic systems typically require high-density printed circuit boards, power and ground planes may of necessity be designed as multiple, segmented regions. Such configurations present an impediment to the objective of minimizing path lengths between package pins and decoupling capacitors.

In addition to specifying an upper circuit board layer as a ground plane to reduce EMI, the embodiments may also use circuit board routing resources to reduce parasitics without relying solely on power and ground plane configuration. For example, an electronic package can be designed using minimum wire length or flip chip connections to minimize package inductance while allowing for optimal pin placement and printed circuit board routing to the coupling capacitors. Additionally, loop inductance may be minimized by disposing power-ground solder ball pairs at the periphery of the electronic package. The power-ground solder ball pairs may thus be connected to respective power and ground conductors on adjacent upper printed circuit board layers electrically connected to local decoupling capacitors. By connecting ground and power to adjacent printed circuit board layers mutual inductance may be reduced, and by providing connections to upper printed circuit board layers via lengths may be minimized.

One embodiment may be configured in a microprocessor package, such as a BGA, a PGA, or a chip scale package (CSP) adapted for use in a handheld wireless communication device, for example. Use of a BGA or PGA package allows for a complex integrated circuit within a relatively small area on the system board of the wireless communication device. The CSP provides for a smaller device package with a smaller pin count than a BGA or a PGA, but may utilize a power/ground pin pair configuration as described below. For high-speed applications, the BGA configuration provides a lower inductance package than a leaded configuration such as the PGA.

Figure 2:
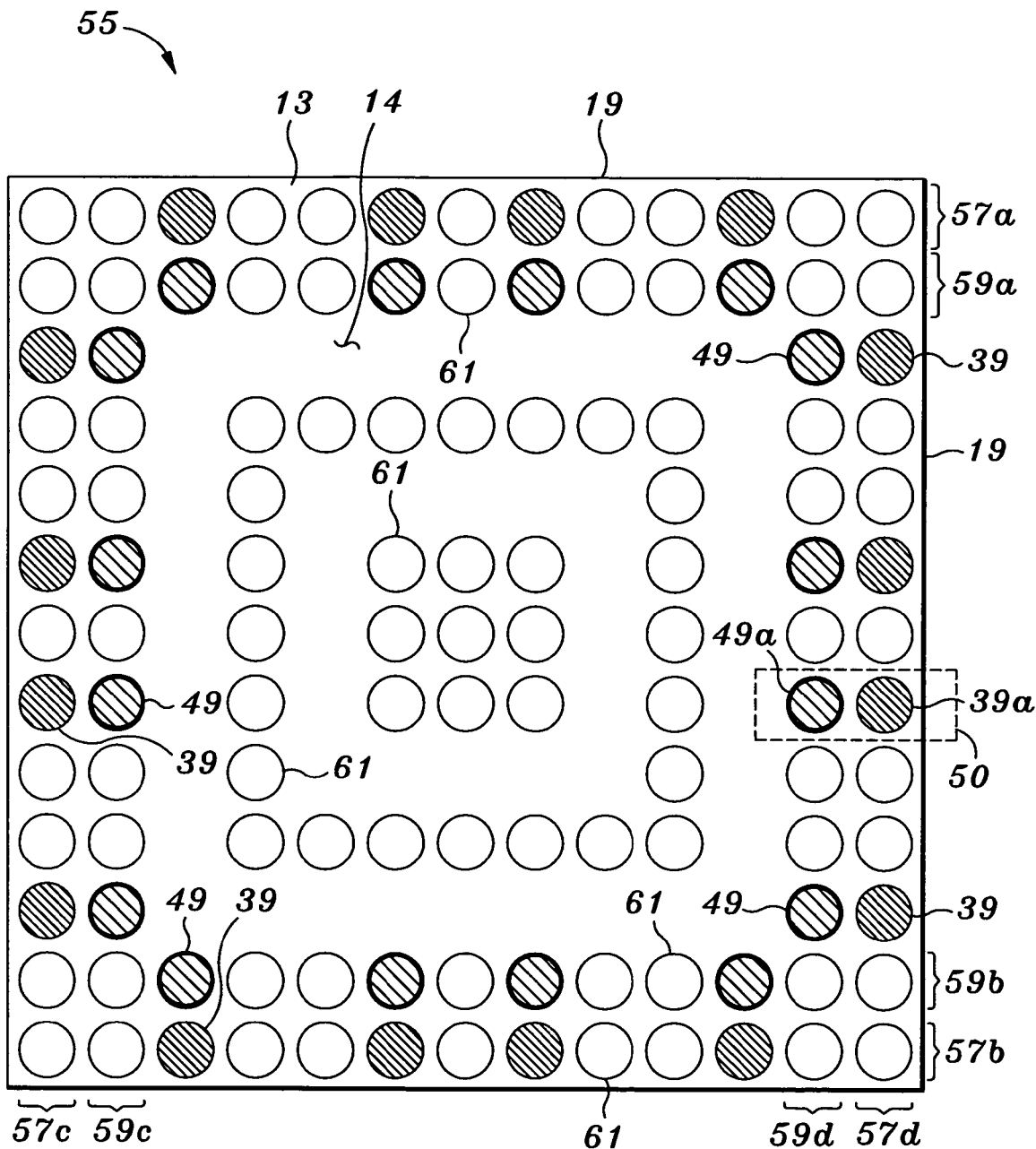
FIG. 2 is a plan view of the solder ball array on the lower surface of the substrate of FIG. 1, in accordance with one embodiment.
Figure 3:
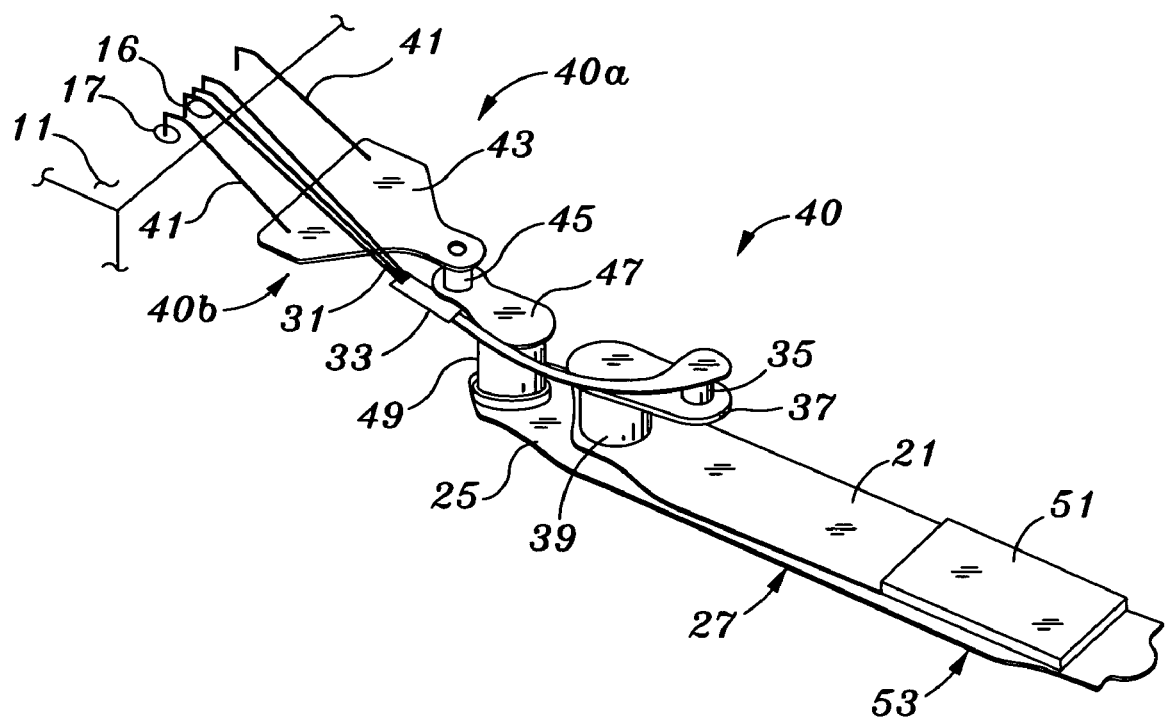
FIG. 3 is diagrammatical isometric representation of an interconnection configuration for a semiconductor device comprising die wire bonds, upper and lower substrate conductive traces, a board power trace in a power supply plane, and a board ground trace in a ground plane in the system printed circuit board of FIG. 1.

Referring to FIGS. 1, 2, and 3, and in accordance with one embodiment, a semiconductor device 10 may include a die 11 mounted to an upper substrate surface 12 of a substrate 13 and encapsulated in a die package 15. The semiconductor device 10 may further include a system printed circuit board 20 with a board ground trace 21 located at an upper board surface 23, a power supply conductive path such as a board power supply trace 25 located in a layer below the board ground trace 21, and a dielectric layer 27 between the board ground trace 21 and the board power supply trace 25. Alternatively, the board ground trace 21 may comprise part of a board ground plane 63 covering a portion of or all of the upper board surface 23.

One or more ground wire bonds 31 may be provided from the die 11 to an upper substrate ground trace 33 on the substrate 13. A substrate ground via 35 may be provided between the upper substrate ground trace 33 and a substrate lower ground trace 37 on a lower substrate surface 14 for electrical connection to the board ground trace 21 by means of a ground solder ball 39. Similarly, one or more power wire bonds 41 may be provided from the die 11 to a substrate upper power trace 43 on the substrate 13. A substrate power via 45 may be provided between the substrate upper power trace 43 and a substrate lower power trace 47 for electrical connection to the board power supply trace 25 by means of a power solder ball 49 and a board power via 29.

The semiconductor device 10 may further include a decoupling capacitor 51 located on the upper board surface 23. One end of the decoupling capacitor 51 may be directly connected to the board ground trace 21 as shown, and another end of the decoupling capacitor 51 may be connected to the board power supply trace 25 by means of a second board power via 53. The ground solder ball 39 can be located at a periphery 19 of the substrate 13. The periphery 19 bounds the upper substrate surface 12 and the lower substrate surface 14. This allows for placement of the decoupling capacitor 51 within a distance "D" of the ground solder ball 39, where the distance "D" can be as small as one millimeter.

In the configuration shown, a cross sectional area (designated as "A") generally bounded by the board ground trace 21, the board power supply trace 25, the board power via 29, and the second board power via 53 can be a smaller area in comparison to a corresponding cross sectional area found in conventional designs. Accordingly, as explained in greater detail above, the EMI produced by current in the board power supply trace 25, as exemplified by the configuration of FIG. 1, can be less than the EMI produced by current in a conventional power supply trace.

A solder ball configuration as shown in FIG. 2 may be used for the semiconductor device 10. An array 55 of solder balls may be attached to the lower substrate surface 14 of the substrate 13. The array 55 may comprise a plurality of power solder balls 49 (i.e., cross-hatched circles), each power solder ball 49 being electrically connected to a respective power wire bond 41 through a respective set of substrate lower power trace 47, substrate power via 45, and substrate upper power trace 43 (see FIG. 1). The array 55 may comprise a plurality of ground solder balls 39 (i.e., solid circles), each ground solder ball 39 being electrically connected to a respective ground wire bond 31 through a respective set of substrate lower ground trace 37, substrate ground via 35, and substrate upper ground trace 33 (see FIG. 1). The ground solder balls 39 may be located at the periphery 19 of the substrate 13. In the configuration shown, the ground solder balls 39 are located in one or more of outermost rows 57a, 57b, 57c, and 57d.

In addition, each power solder ball 49 may be paired with an adjacent ground solder ball 39, to reduce electromagnetic emission from a conducted power signal. For example, a ground solder ball 39a and a power solder ball 49a may be connected to the same power source (not shown). Accordingly, the ground solder ball 39a is positioned at the periphery 19 and the power solder ball 49a is positioned adjacent to the ground solder ball 39a to form a power/ground solder ball pair 50 (denoted by a dashed box). As a power signal flows in (or out) through the ground solder ball 39a and out (or in) through the power solder ball 49a, the resulting electromagnetic emission from the power/ground solder ball pair 50 can be minimized by the physical proximity of the ground solder ball 39a to the power solder ball 49a. Accordingly, in the configuration shown, the power solder balls 49 are located in one or more of adjacent outer rows 59a, 59b, 59c, and 59d. A plurality of solder balls 61 (i.e., open circles) may be used for signals and other electrical connections.

It can be appreciated by one skilled in the relevant art that, while pins on the periphery of a conventional substrate may generally be reserved for high-speed signal paths, signals of 100 MHz or below can be routed to interior pins, such as the signal ball 61 without incurring timing problems resulting from an increased signal path length.

As shown in FIG. 3, a decoupling branch 40 may include a first conductive path 40a from a die ground termination 16 to the decoupling capacitor 51, and a second conductive path 40b from the decoupling capacitor 51 to a die power termination 17. The first conductive path 40a may include the ground wire bond 31, the substrate upper ground trace 33, the substrate ground via 35, the substrate lower ground trace 37, the ground solder ball 39, and the board ground trace 21. The length of the board ground trace 21 may be about one millimeter. The second conductive path 40b may include the board power supply trace 25, the power solder ball 49, the substrate lower power trace 47, the substrate power via 45, the substrate upper power trace 43, and the power wire bond 41. As shown in the illustration, the width, shape and position of the board ground trace 21 can largely conform to the width, shape, and location of the board power supply trace 25, with a separation provided by the dielectric layer 27.

The configuration shown in FIGS. 1 and 3 may further provide electromagnetic shielding by utilizing the ground plane 63 at the upper board surface 23 as an exterior ground, and by placing a power supply conductive path such as a power supply plane 65 at the next interior layer to provide for coupled routing of the power signals. Moreover, by using outer row pins for ground connections, such as the ground solder balls 39 located in one or more of the outermost rows 57a, 57b, 57c, and 57d at the periphery 19 of the substrate 13, the physical distance between a decoupling capacitor, such as the decoupling capacitor 51, and a corresponding ground solder ball 39 can be minimized in comparison to conventional configurations.

As understood by one skilled in the relevant art, high-speed signals route on the surface of a substrate of a printed circuit board producing EMI, and often require a metal can or metalized plastic shielding over the die and substrate, and over adjacent high-speed circuits, when present. With the power and the ground at the surface and with the board ground trace 21 disposed opposing the board power supply trace 25 (i.e., overlapping and separated by the dielectric layer 27), as disclosed herein, electromagnetic shielding is "built-in," reducing the need for exterior shielding. In a conventional configuration, the power may be distributed by means of interior power planes. Using such configurations, a die with multiple power rails for power collapsing might require a system board of up to eighteen layers. Providing power on or at a board surface layer, such as in the embodiment shown, may reduce the need for power vias, and may also remove the need for a power plane. This makes board routing easier and may provide for a reduced substrate layer count, resulting in cost savings.

Moreover, by reducing parasitics in the disclosed embodiments, it may be possible to improve the performance of a power supply which provides power to the semiconductor device 10. For example, loop inductance may be reduced or minimized by using one or more power-ground solder ball pairs 50 disposed at the periphery 19 of the semiconductor device 10. The power solder ball 49 and the ground solder ball 39 may be preferably connected on the system printed circuit board 20 to the respective board power supply trace 25 and board ground trace 21 on adjacent upper layers leading to the local decoupling capacitor 51. As can be appreciated by one skilled in the relevant art, using adjacent layers in this way serves to provide mutual inductance, and using upper layers for ground and power allows ground and power via lengths to be minimized. Additionally, by designating an upper board layer to be a ground layer, EMI may be further reduced.

Figure 4:
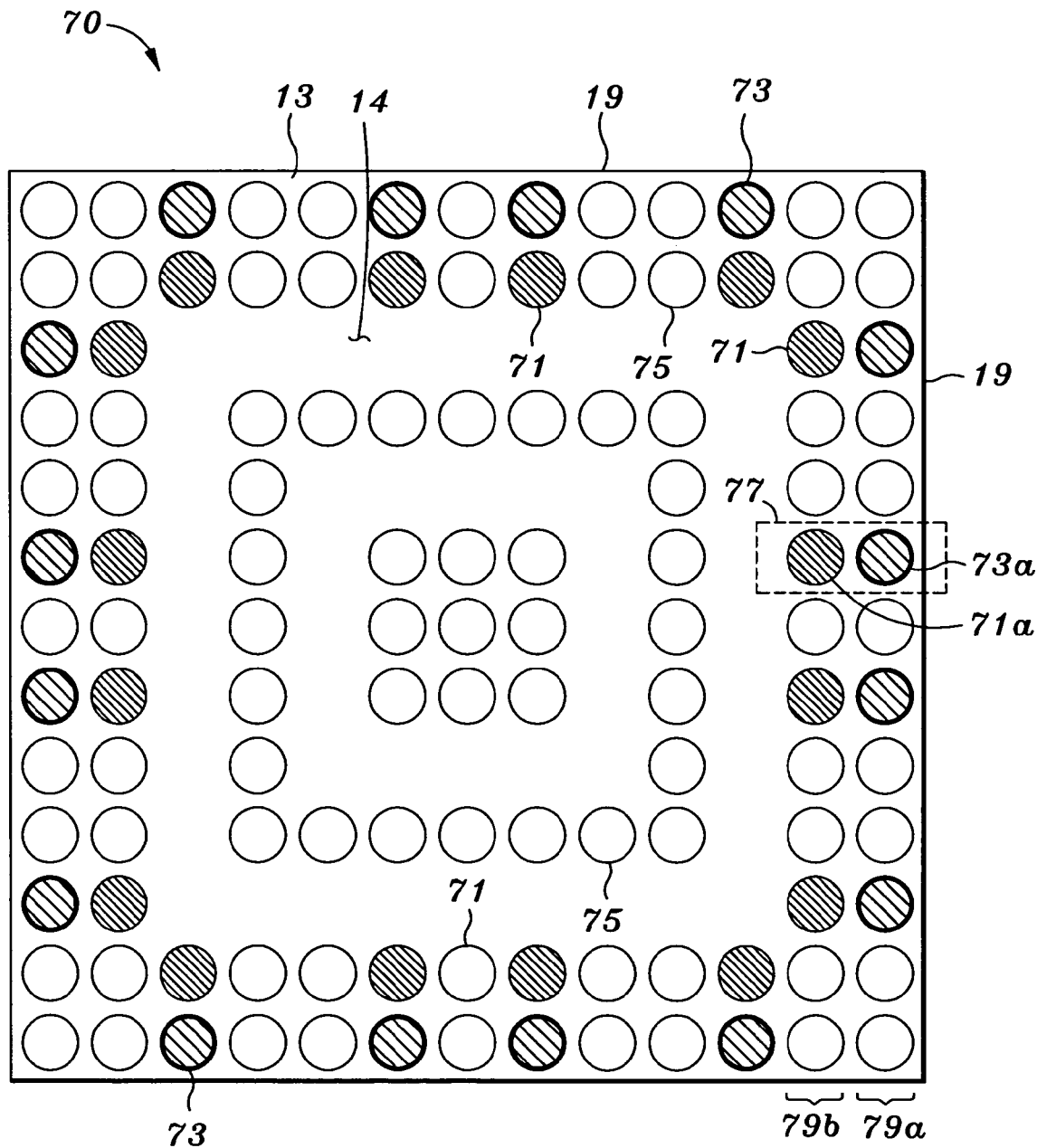
FIG. 4 is a plan view of an alternative solder ball array for the lower surface of the substrate of FIG. 1.

In an alternative embodiment, a solder ball configuration as shown in FIG. 4 may be used with the semiconductor device 10. An array 70 of solder balls may be attached to the lower substrate surface 14 of the substrate 13. The array 70 may comprise a plurality of ground solder balls 71 (i.e., solid circles), each ground solder ball 71 being electrically connected to a respective ground wire bond 31 through a respective set of substrate lower ground trace 37, substrate ground via 35, and substrate upper ground trace 33 (see FIG. 1). The array 70 may comprise a plurality of power solder balls 73 (i.e., cross-hatched circles), each power solder ball 73 being electrically connected to a respective power wire bond 41 through a respective set of substrate lower power trace 47, substrate power via 45, and substrate upper power trace 43 (see FIG. 1).

The power solder balls 73 may be located at the periphery 19 of the substrate 13. In the configuration shown, the power solder balls 73 may be located in one or more outermost rows, such as outermost row 79a, and the ground solder balls 71 may be located in one or more adjacent outer rows, such as adjacent outer row 79b. Each power solder ball 73 may be paired with an adjacent ground solder ball 71, to form a power/ground solder ball pair 77 (denoted by a dashed box).

Figure 5:
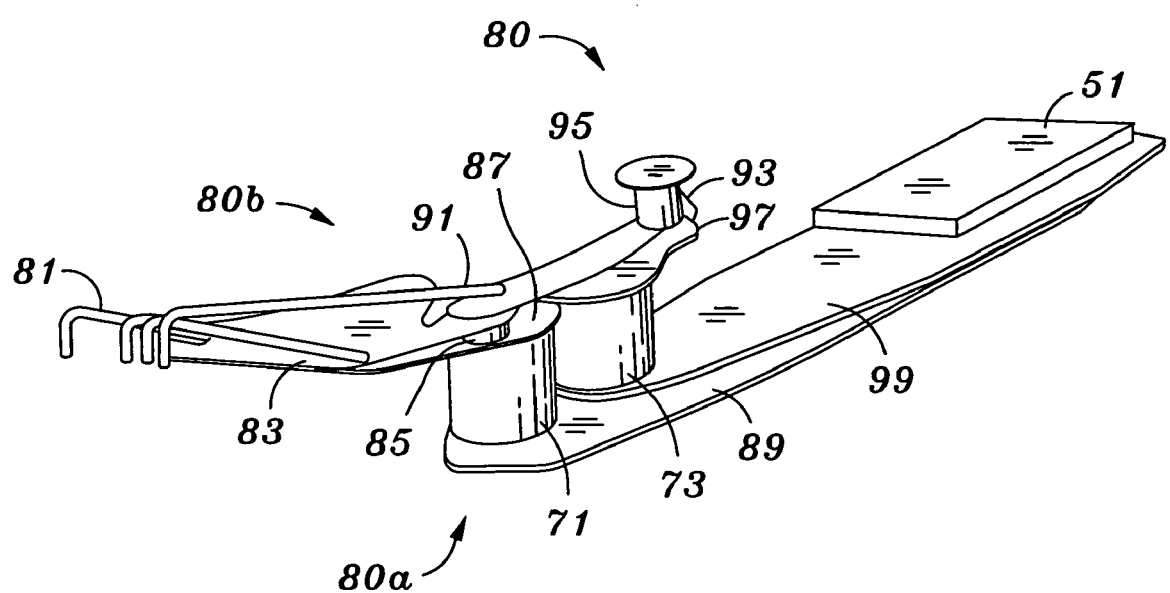
FIG. 5 is diagrammatical isometric representation of an alternative interconnection configuration for a semiconductor device comprising die wire bonds, upper and lower substrate conductive traces, a board ground trace, and a board power trace.
Figure 6:
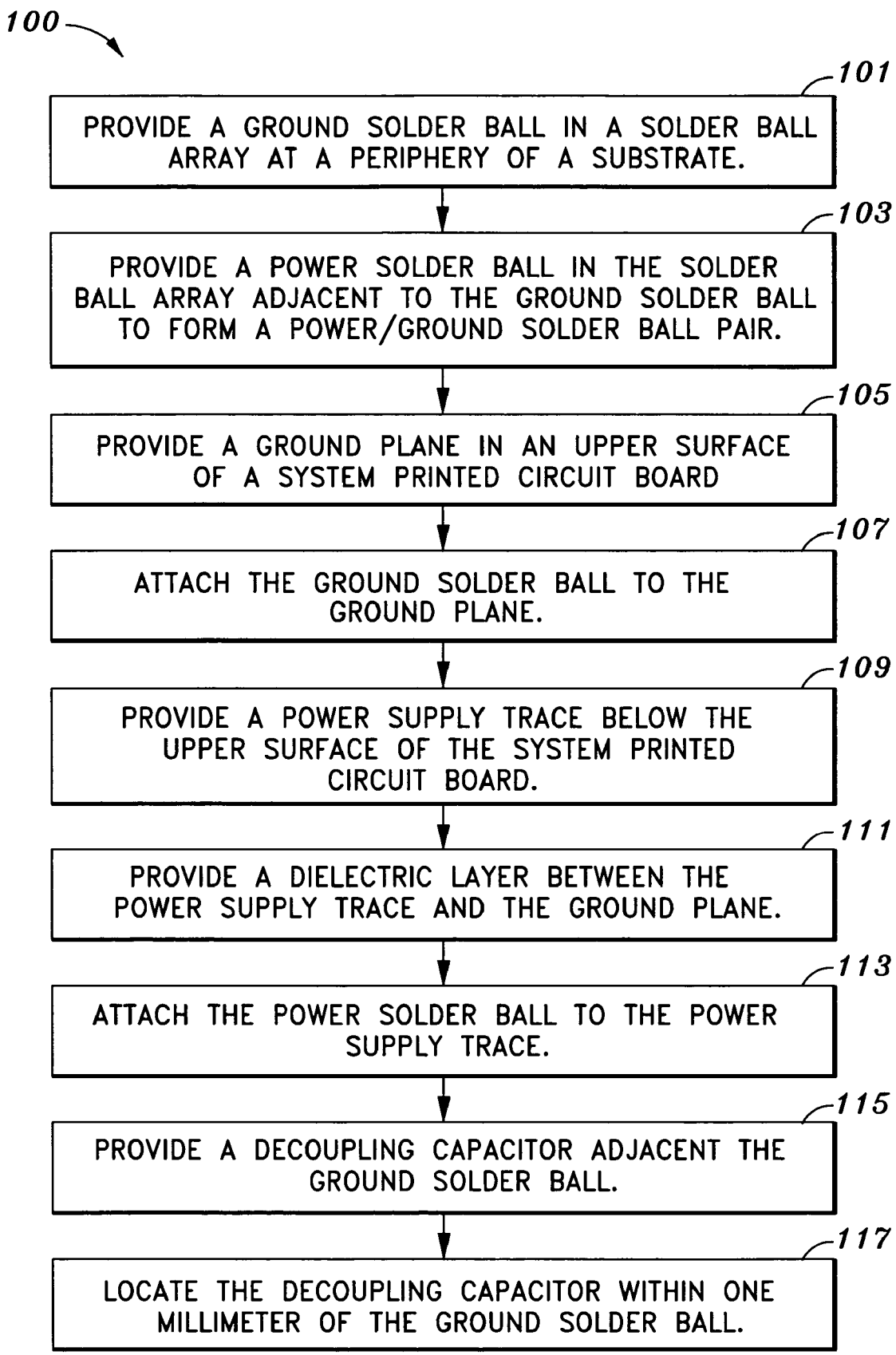
FIG. 6 is a flowchart illustrating a method of providing power and ground connections to the semiconductor device of FIG. 3, as may be specified in accordance with one embodiment.

In yet another alternative embodiment, shown in FIG. 5, a decoupling branch 80 may include a first conductive path 80a from a die ground termination (not shown) to the decoupling capacitor 51, and a second conductive path 80b from the decoupling capacitor 51 to a die power termination (not shown). The first conductive path 80a may include a ground wire bond 81, a substrate upper ground trace 83, a substrate ground via 85, a substrate lower ground trace 87, the ground solder ball 71, and a board ground trace 89. The second conductive path 80b may include a board power supply trace 99, the power solder ball 73, a substrate lower power trace 97, a substrate power via 95, a substrate upper power trace 93, and a power wire bond 91. The decoupling capacitor 51 may be electrically connected to the board ground trace 89 and to the board power supply trace 99. As shown in FIG. 4, the power solder ball 73 can be located at the periphery 19 of the substrate 13.

A method for providing power to a semiconductor device having a substrate attached to an upper surface of a system printed circuit board by means of a solder ball array is shown in a flow diagram 100 of FIG. 4. A ground solder ball—such as the ground solder ball 39—may be provided in the solder ball array at a periphery of the substrate—such as the substrate 13—at step 101. A power solder ball—such the power solder ball 49—may be provided in the solder ball array—such as the solder ball array 55—adjacent to the ground solder ball to form a power/ground solder ball pair—such as the power/ground solder ball pair 50, at step 103. A ground plane—such as the ground plane 63—may be provided in the upper surface of the system printed circuit board, at step 105. The ground solder ball may be attached to the ground plane, at step 107. A power supply trace—such as the board power supply trace 25—may be provided below the upper surface of the system printed circuit board, at step 109. A dielectric layer—such as the dielectric layer 27—may be provided between the power supply trace and the ground plane, at step 111. The power solder ball may be attached to the power supply trace, at step 113. A decoupling capacitor—such as the decoupling capacitor 51—may be provided adjacent the ground solder ball, at step 115 and may be located less than five millimeters from, and preferably within one millimeter of, the ground solder ball, at step 117. In a conventional configuration, the distance from the ground solder ball and the decoupling capacitor can be five millimeters or more. As can be appreciated by one skilled in the art, the foregoing method also functions to minimize voltage drop and also reduces electromagnetic emissions.

It should be understood, of course, that the foregoing relates to exemplary embodiments and that modifications may be made without departing from the spirit and scope of the embodiments as set forth in the following claims.

We claim:

1. A semiconductor device, comprising:
 a substrate comprising
  an upper substrate surface with an upper substrate ground trace and an upper substrate power trace;
  a lower substrate surface with a lower substrate ground trace, a lower substrate power trace, and a periphery;
  a substrate ground via electrically connecting the lower substrate ground trace to the upper substrate ground trace; and
  a substrate power via electrically connecting the lower substrate power trace to the upper substrate power trace;
 a die mounted on the upper substrate surface, the die having a first wire bond electrically connecting the die to the upper substrate ground trace, the die having a second wire bond electrically connecting the die to the upper substrate power trace;
 an array of solder balls attached to the lower substrate surface, the array comprising:
  a first set of ground solder balls that are positioned immediately next to the periphery;
  a second set of power solder balls;
  a power/ground solder ball pair composed of a first ball selected from the first set and a second ball selected from the second set, the first ball and the second ball being immediately next to each other, the first ball electrically connected to the lower substrate ground trace, and the second ball electrically connected to the lower substrate power trace; and wherein each ground solder ball on the lower substrate surface is positioned immediately next to the periphery, and wherein each power solder ball on the lower substrate surface is positioned immediately next to one of the ground solder balls.

2. The semiconductor device of claim 1, further comprising a system printed circuit board comprising:

a ground plane electrically connected to the ground solder balls, wherein the ground plane is positioned on an upper surface of the system printed circuit board; and a power supply trace electrically connected to the power solder balls, wherein the power supply trace is positioned below the upper surface of the system printed circuit board.

3. The semiconductor device of claim 2, wherein said system printed circuit board further comprises a dielectric layer between said power supply trace and said ground plane.

4. The semiconductor device of claim 2, wherein the system printed circuit board comprises a decoupling capacitor.

5. The semiconductor device of claim 4, wherein the decoupling capacitor is electrically connected to the ground plane.

6. A semiconductor device, comprising:

a substrate having an upper substrate surface, a lower substrate surface, an upper substrate ground trace providing an electrical path to said lower substrate surface through a substrate ground via immediately next to a substrate periphery, and an upper substrate power trace providing an electrical path to said lower substrate surface through a substrate power via;

a system printed circuit board including a power supply conductive path and an upper board surface having a ground plane;

an array of solder balls attached to the lower substrate surface, the array comprising:

a first set of ground solder balls that are positioned immediately next to the periphery;

a second set of power solder balls;

a plurality of power/ground solder ball pairs, each pair composed of a first ball selected from the first set and a second ball selected from the second set, the first ball and the second ball being immediately next to each other, the first ball electrically connected to the substrate ground via, and the second ball electrically connected to the substrate power via; and a die mounted to said upper substrate surface, said die including a wire bond electrically connecting said die to said upper substrate ground trace;

wherein each ground solder ball on the lower substrate surface is positioned immediately next to the periphery, and wherein each power solder ball on the lower substrate surface is positioned immediately next to one of the ground solder balls.

7. A semiconductor device, comprising:

a substrate having an upper substrate surface, a lower substrate surface, and a periphery bounding said upper substrate surface and said lower substrate surface, said substrate further having an upper substrate ground trace providing an electrical path to a lower substrate ground trace on said lower substrate surface through a substrate ground via at said periphery and an upper substrate power trace providing an electrical path to a lower substrate power trace on said lower substrate surface through a substrate power via;

a system printed circuit board including an upper board surface having a ground plane and a power supply plane disposed parallel and next to said ground plane, said upper board surface including a board ground trace electrically connected to said ground plane, said power supply ground plane further including a board power supply trace disposed opposing said board ground trace;

an array of solder balls attached to the lower substrate surface, the array comprising:

a first set of ground solder balls each of which are positioned immediately next to the periphery;

a second set of power solder balls;

a plurality of power/ground solder ball pairs, each pair composed of a first ball selected from the first set and a second ball selected from the second set, the first ball and the second ball being immediately next to each other, the first ball electrically connected to the lower substrate ground trace, and the second ball electrically connected to the substrate power via; and a die mounted to said upper surface;

a wire bond connecting said die to said substrate ground via through said upper substrate ground trace; and a decoupling capacitor disposed on said upper board surface and electrically attached to said lower substrate ground trace;

wherein each ground solder ball on the lower substrate surface is positioned immediately next to the periphery, and wherein each power solder ball on the lower substrate surface is positioned immediately next to one of the ground solder balls.

8. The semiconductor device of claim 7, wherein said decoupling capacitor is electrically attached to said power supply plane.

9. A decoupling branch suitable for attachment to a high speed-die, said decoupling branch comprising:

a decoupling capacitor;

a substrate having a substrate upper surface with an upper substrate ground trace and an upper substrate power trace, the substrate having a substrate lower surface with a lower substrate ground trace and a lower substrate power trace, the substrate further having a periphery;

an array of solder balls attached to the substrate lower surface, the array comprising:

a first set of ground solder balls that are positioned immediately next to the periphery; and a second set of power solder balls;

a first conductive path electrically connecting a die ground termination to said decoupling capacitor, said first conductive path including a ground wire bond, an upper substrate ground trace, a substrate ground via immediately next to the periphery, a lower substrate ground trace, a ground solder ball disposed immediately next to the periphery, and a board ground trace; and a second conductive path electrically connecting a die power termination to said decoupling capacitor, said second conductive path including a board power supply trace, a power solder ball, a lower substrate power trace, a substrate power via, an upper substrate power trace, and a power wire bond, said power solder ball disposed immediately next to said ground solder ball to form a power/ground solder ball pair at said substrate periphery;

wherein each ground solder ball on the substrate lower surface is positioned immediately next to the periphery, and wherein each power solder ball on the substrate lower surface is positioned immediately next to one of the ground solder balls.

10. The decoupling branch of claim 9, wherein said board ground trace comprises a length of about one millimeter.

11. The decoupling branch of claim 9, further comprising a dielectric layer disposed between said board ground trace and said board power supply trace.

12. A semiconductor device, comprising:
a substrate having an upper substrate surface, a lower substrate surface, and a periphery bounding said upper and lower substrate surfaces, said upper substrate surface further having at least one upper substrate power trace providing an electrical path to at least one substrate lower power trace on said lower substrate surface through at least one substrate power via at said periphery;
an array of solder balls attached to the lower substrate surface, the array composed of a first set of ground solder balls that are positioned immediately next to the periphery and a second set of power solder balls, the array having a plurality of power/ground solder ball pairs, each pair composed of a first ball selected from the first set and a second ball selected from the second set, the first ball and the second ball being immediately next to each other, the first ball electrically connected to the substrate lower power trace, and the second ball electrically connected to the lower substrate ground trace;
a system printed circuit board including an upper board surface having a power plane electrically connected to at least one power solder ball and a ground plane electrically connected to at least one ground solder ball; and
a die mounted to said upper substrate surface, said die including a wire bond electrically connecting said die to said at least one substrate power via;
wherein each ground solder ball on the lower substrate surface is positioned immediately next to the periphery, and wherein each power solder ball on the lower substrate surface is positioned immediately next to one of the ground solder balls.

13. A wireless communication device having a high-speed, high pin-count semiconductor device, said wireless communication device comprising:
a decoupling capacitor;
a substrate;
an array of solder balls attached to a lower surface of the substrate, the array comprising:
a first set of ground solder balls that are positioned immediately next to a periphery of the substrate; and
a second set of power solder balls;
a first conductive path electrically connecting a semiconductor device ground termination to said decoupling capacitor, said first conductive path including a ground wire bond, an upper substrate ground trace, a substrate ground via immediately next to the periphery of said substrate, a lower substrate ground trace, a ground solder ball immediately next to the periphery, and a board ground trace, wherein said board ground trace comprises a length of about one millimeter; and
a second conductive path electrically connecting a semiconductor device power termination to said decoupling capacitor, said second conductive path including a board power supply trace, a power solder ball, a lower substrate power trace, a substrate power via, an upper substrate power trace, and a power wire bond, said power solder ball disposed immediately next to said ground solder ball to form a power/ground solder ball pair;
wherein each ground solder ball on the lower surface of the substrate is positioned immediately next to the periphery, and wherein each power solder ball on the lower surface of the substrate is positioned immediately next to one of the ground solder balls.

14. The wireless communication device of claim 13, wherein said board ground trace comprises a length of less than five millimeters.

15. The wireless communication device of claim 13, further comprising dielectric means for separating said ground plane from said power supply trace.

16. A semiconductor device, comprising:
solder ball array means for attaching a substrate to a system printed circuit board having a ground plane and a power supply trace, said solder ball array means providing a plurality of power/ground solder ball pairs on a lower surface of the substrate, each power/ground solder ball pair including a ground solder ball disposed immediately next to a periphery of the substrate and a power solder ball immediately next to the ground solder ball, wherein each power/ground solder ball pair provides electrical attachment of the substrate to the decoupling means;
wire bond means for providing an electrical path from a die mounted on said substrate to a ground solder ball disposed immediately next to said substrate periphery; and
decoupling means connected between said ground plane and said power supply trace;
wherein each ground solder ball on the substrate lower surface is positioned immediately next to the periphery, and wherein each power solder ball on the substrate lower surface is positioned immediately next to one of the ground solder balls.

\* \* \* \* \*